United States Patent [19]
Ono

[11] Patent Number: 6,040,675
[45] Date of Patent: *Mar. 21, 2000

[54] SUPPORTING APPARATUS USING MAGNETIC POWER

[75] Inventor: Kazuya Ono, Yokohama, Japan

[73] Assignee: Nikon Corporation, Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/870,982

[22] Filed: Jun. 6, 1997

[30] Foreign Application Priority Data

Jun. 7, 1996  [JP]  Japan ................................ 8-146031

[51] Int. Cl.[7] .................................................. H01L 21/68
[52] U.S. Cl. ........................................... 318/649; 108/146
[58] Field of Search .................................. 318/648, 649, 318/687; 74/471 XY, 490.7; 108/1, 2, 20, 144, 146; 269/58, 71

[56] References Cited

U.S. PATENT DOCUMENTS

| | | |
|---|---|---|
| 3,609,356 | 9/1971 | Schwuttke et al. .................... 250/51.5 |
| 4,087,729 | 5/1978 | Yamazaki et al. ...................... 318/601 |
| 4,952,858 | 8/1990 | Galburt . |
| 5,161,177 | 11/1992 | Chiba . |
| 5,204,712 | 4/1993 | Bouwer et al. ........................... 355/53 |
| 5,294,854 | 3/1994 | Trumper . |
| 5,524,502 | 6/1996 | Osanai ................................. 74/490.07 |
| 5,537,186 | 7/1996 | Korenaga et al. ......................... 355/53 |
| 5,780,943 | 7/1998 | Ono ......................................... 310/12 |
| 5,858,587 | 1/1999 | Yamane et al. ........................... 430/22 |

FOREIGN PATENT DOCUMENTS

| | | |
|---|---|---|
| 0 403 262 | 12/1990 | European Pat. Off. . |
| 0 421 528 | 4/1991 | European Pat. Off. . |
| 0 595 785 | 5/1994 | European Pat. Off. . |

*Primary Examiner*—Bentsu Ro

[57] ABSTRACT

A supporting apparatus for supporting a table having N degrees of freedom, where N is an integer greater than one. The apparatus includes a stage and a leaf spring mounted on the stage. The spring initially contacts the table at a contact point and has a coefficient of elasticity greater in the horizontal direction and smaller in the vertical direction. The spring also has a characteristic of positive rigidity. A pair of permanent magnets are mounted in an area between the stage and table in a vertical direction for counterbalancing the characteristic of positive rigidity of the leaf spring.

46 Claims, 11 Drawing Sheets

SUPPORTING APPARATUS USING MAGNETIC POWER

BACKGROUND OF THE INVENTION

The present invention relates to supporting apparatus. More particularly, the present invention relates to precise position control devices using magnetic power. For example, such supporting apparatus can be used for microlithography instruments.

FIG. 11 illustrates a conventional magnetic levitation supporting apparatus. FIG. 11(a) is a first example of such conventional supporting apparatus. FIG. 11((b) is a second example of the conventional supporting apparatus.

In the first example, permanent magnets 103 and electromagnets 105 are secured on a stage 101. Permanent magnets 103 and irons 107 are secured on a table 112. A wafer 110 is mounted on the table 112. Permanent magnets 103 of the stage 101 and permanent magnets 103 of the table 112 repel each other, because of like magnetic poles facing each other. This force of repulsion levitates the table 112. A sensor (not shown) detects the height of the table 112. A controller (not shown) changes the electric current of the electro-magnets 105 based on the height detected by the sensor so as to maintain the table 112 at a desired height.

In the second example (FIG. 11b), permanent magnets 103, arms 109, and electromagnets 105 are secured on the stage 101. Permanent magnets 103 and irons 107 are secured on the table 112. A wafer 110 is mounted on the table 112. Permanent magnets 103 of the stage 101 and permanent magnets 103 of the table 112 attract each other, because of facing opposite magnetic poles. The resulting attractive force levitates the table 112. A sensor (not shown) detects the height of the table 112. A controller (not shown) changes the electric current of the electromagnets 105 based on the height detected by the sensor so as to maintain the table 112 at a desired height.

However, these conventional stages have some problems as follows.

First of all. it is difficult for the conventional first and second stages to maintain the height (Z direction) because the table 112 is only supported by the repulsive or attractive force constant between the permanent magnets 103.

Second, it is difficult to maintain the force relationship between the electromagnets 105 and the permanent magnets 103. That is, when the table 112 is moved up and down by the electromagnets 105, the distance between the table 112 and the stage 101 changes. Therefore, the distance between the permanent magnets 103 fixed thereto inevitably changes. Accordingly, the repulsive or attractive force of permanent magnets 103 also changes.

Third, it is necessary to consume a lot of electric current to support the table at a different Δz position with respect to maintaining the table 112 at a predetermined position. Therefore electric current consumption increases and the electromagnets 105 generate heat because the electric current flows constantly. The heat affects the stage 101 to adversely influence the precision of the height (position) of the table 112.

SUMMARY OF THE INVENTION

An object of the present invention is to provide a supporting apparatus that overcomes the drawbacks noted above in the conventional apparatus and is capable of precisely controlling the position of a table having N degrees of freedom, where N is an integer greater than one, in a simple manner.

It is another object of the present invention to provide a supporting apparatus that consumes little electric current when the table 112 is supported at a different position, Δz, from that of maintaining the table 112 at a predetermined position.

These and other objects of the present invention are achieved by providing a supporting apparatus including a stage. A guide or leaf spring is mounted on the stage and contacts the table. The guide possesses a coefficient of elasticity which is greater in the horizontal direction and smaller in the directions perpendicular thereto and a characteristic of positive rigidity. The table member possesses N degrees of freedom with respect to the stage. The permanent magnet system possesses a negative rigidity characteristic which counterbalances the positive rigidity characteristic of the guide.

As shown in FIG. 5 and FIG. 6, the guide has characteristics of positive rigidity (indicated by B), this characteristic is linear. It is easy to design the inclination of positive rigidity.

On the other hand, the repulsive or attractive force of permanent magnets has characteristics of negative rigidity (indicated by A). This characteristic is linear, but it is also easy to design the strength of the permanent magnets.

A supporting apparatus can comprise an electromagnetic driving system having at least three electromagnets for driving the table. The table is driven in the perpendicular direction when all of the three electromagnets are equally energized at the same time. The table is tilted when only one or two of the electromagnets are energized.

An advantage of the apparatus incorporating the principles of the present invention is that the electromagnetic driving system consumes little electric current. Additionally, the guide cancels the force and moment of the table member to produce little force and moment to the table member.

BRIEF DESCRIPTION OF THE DRAWINGS

The above and other objects, features, and advantages of the present invention will become more apparent from the following detailed description taken with the accompanying drawings, in which.

DETAILED DESCRIPTION OF THE PREFERRED EMBODIMENTS

Figure 1:
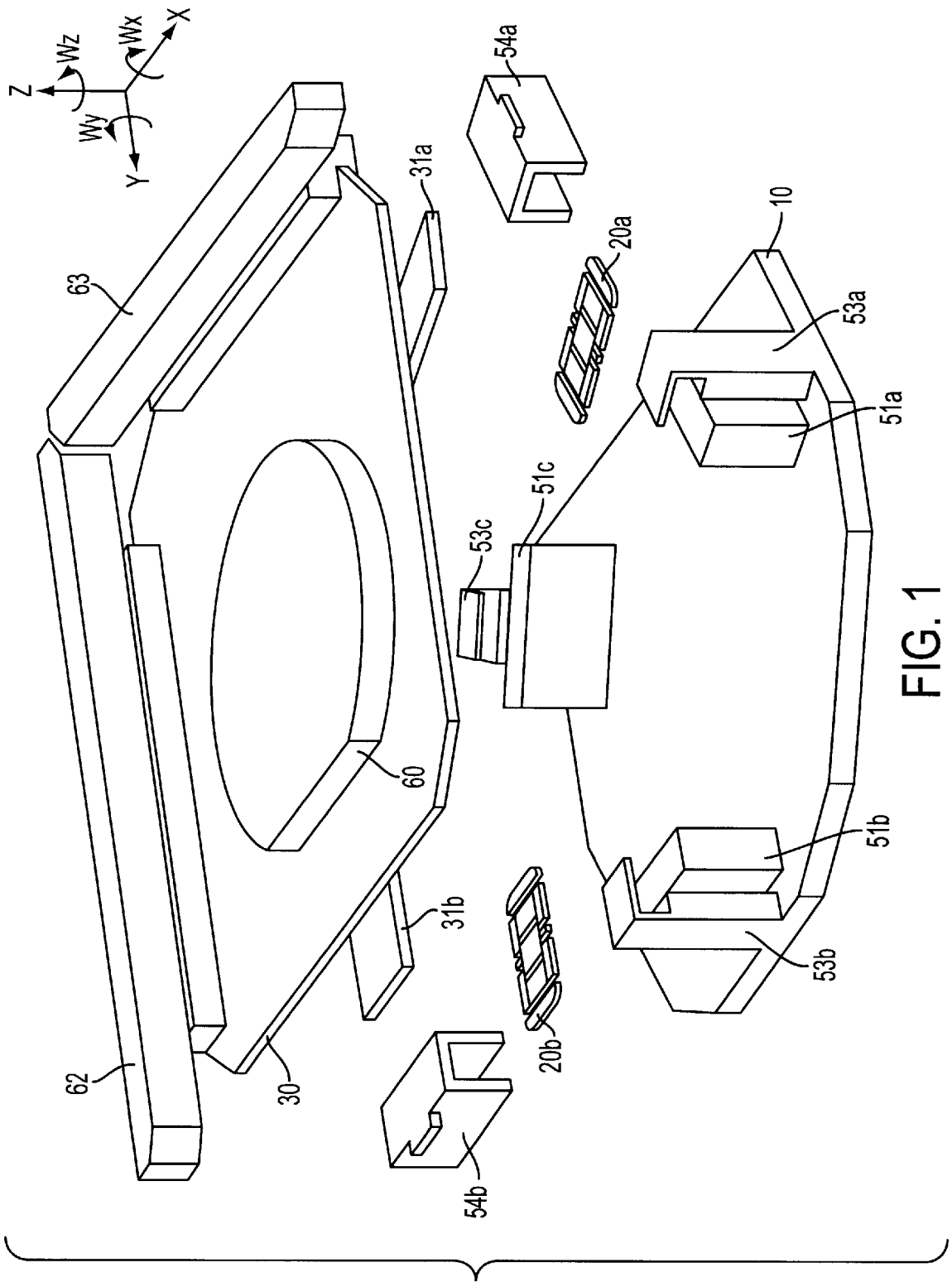
FIG. 1 is an exploded three-dimensional view of a first embodiment of the support system of the present invention.
Figure 2:
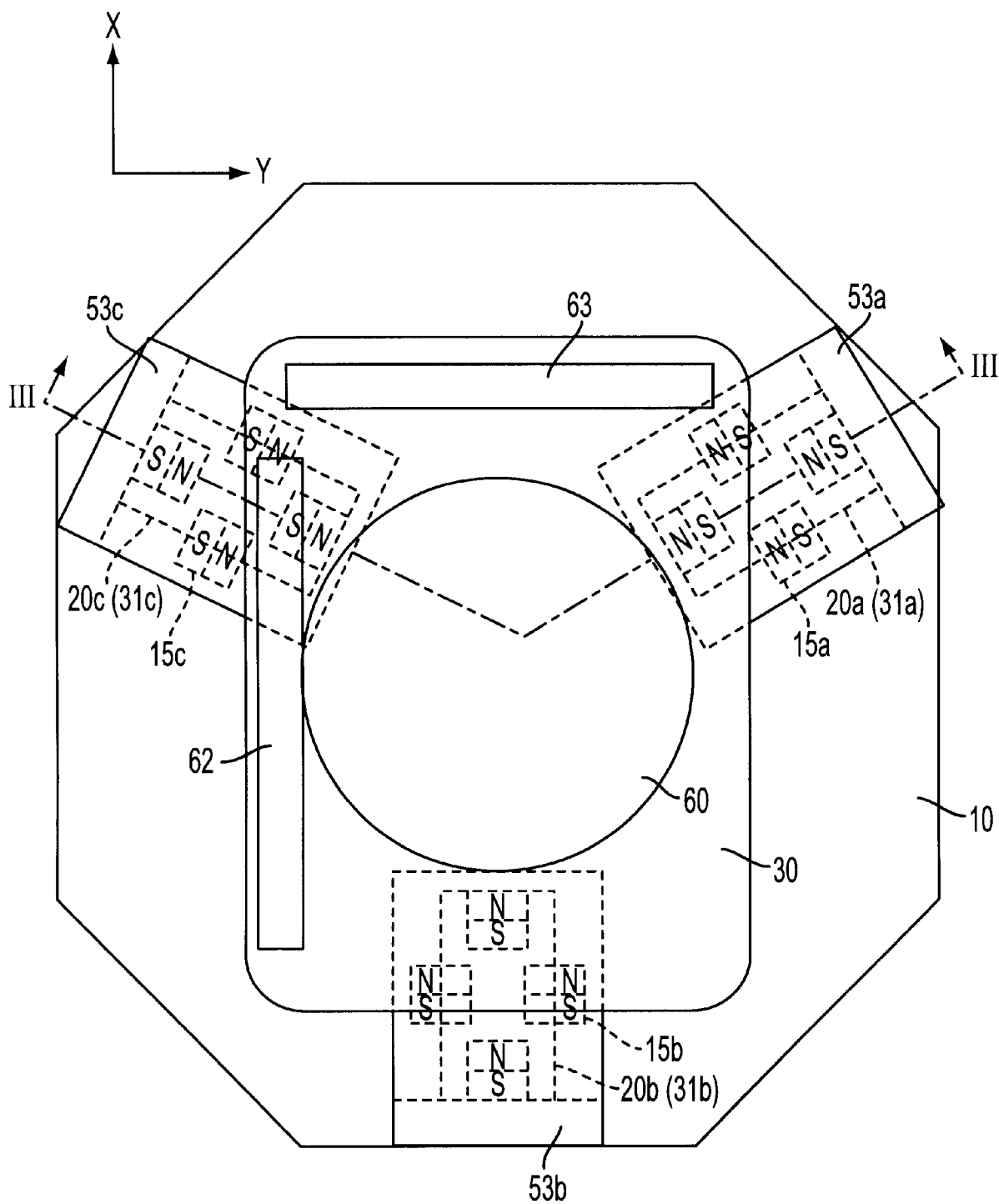
FIG. 2 is a plan view of the support system of the first embodiment.
Figure 3:
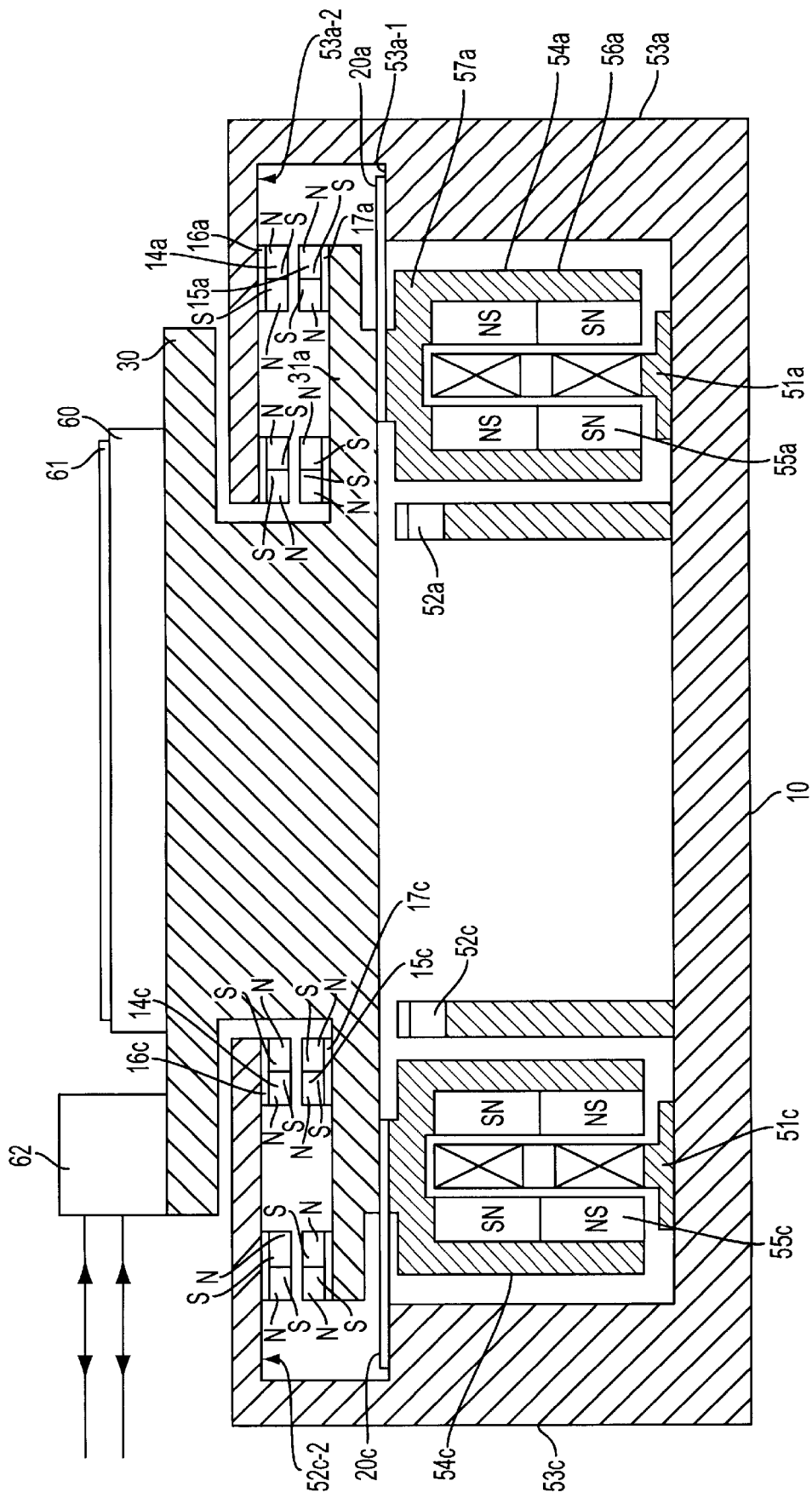
FIG. 3 is a cross-sectional view of the support system shown in FIG. 2 taken along the line III—III and turned ninety degrees.

Referring to the drawings, FIG. 1 is an exploded three-dimensional view of the support system of the first embodiment, FIG. 2 is a plan view, and FIG. 3 is a cross-sectional view of the support system shown in FIG. 2 taken along the line III—III.

The support system includes a stage 10 which may be made from materials such as ceramics or carbon fibers in order to maximize rigidity while maintaining light weight. A table 30 is arranged above the stage 10 as best seen in FIGS. 1 and 3. The table 30 has extensions 31a–31c. Three stators (single-phase coils) 51a–51c for a bipolar single-phase linear motor unit 50 (referred to as LDM) which comprise an electromagnetic driving system, are installed along the edge of stage 10, 120 degrees apart from each other. Furthermore, height detectors (such as capacitance sensors) 52a–52c are installed near the stators as shown in FIG. 3. Height detector 52b is not shown in the cross-sectional view of FIG. 3, but is also spaced 120 degrees from the other height detectors. The capacitance sensors detect the Z-direction movement of stage 10 and table 30.

Connectors 53a–53c are mounted on the stage 10 respectively supporting the stators 51a–51c. Each of the connectors 53a–53c are respectively equipped with a leaf spring 20a–20c and permanent magnets 14. As shown in FIG. 3, a leaf spring 20a is attached to a first surface 53a-1 of connector 53a. Permanent magnets 14 (made of materials such as cobalt, nickel or neodymium iron boron) are affixed to a second surface 53a-2 of the connector 53a through a yoke 16.

Leaf springs 20a–20c are made of a thin metal plate (such as stainless steel) having a rectangular shape, and are attached to the connectors 53a–53c respectively as well as to the extensions 31a–31c of table 30. In other words, leaf springs 20a–20c are thin and long, making its coefficient of elasticity (Young's modulus) to be greater in the horizontal directions (X,Y direction) and smaller in directions other than horizontal (such as Z, Wx [rotation around the X-axis] as well as Wy [rotation around the Y-axis]).

LDM 50 has rotors 54a–54c which are arranged so as to sandwich the respective stators 51a–51c therebetween, and each rotor is equipped with two permanent magnets 55 placed alongside in the Z direction. As shown in FIG. 3, rotors 54a–54c are affixed so that the leaf spring 20a–20c comes between the rotors and table 30. Each of the rotors 54a–54c is installed on the table 30 at a 120-degree angle apart from each other, corresponding to the location of the respective stators 51a–51c. Rotors 54, as shown in FIG. 3, consist of a permanent magnet part 55 (which is made of material such as cobalt, nickel, or neodymium iron boron) and the yoke 56 section.

Figure 4:
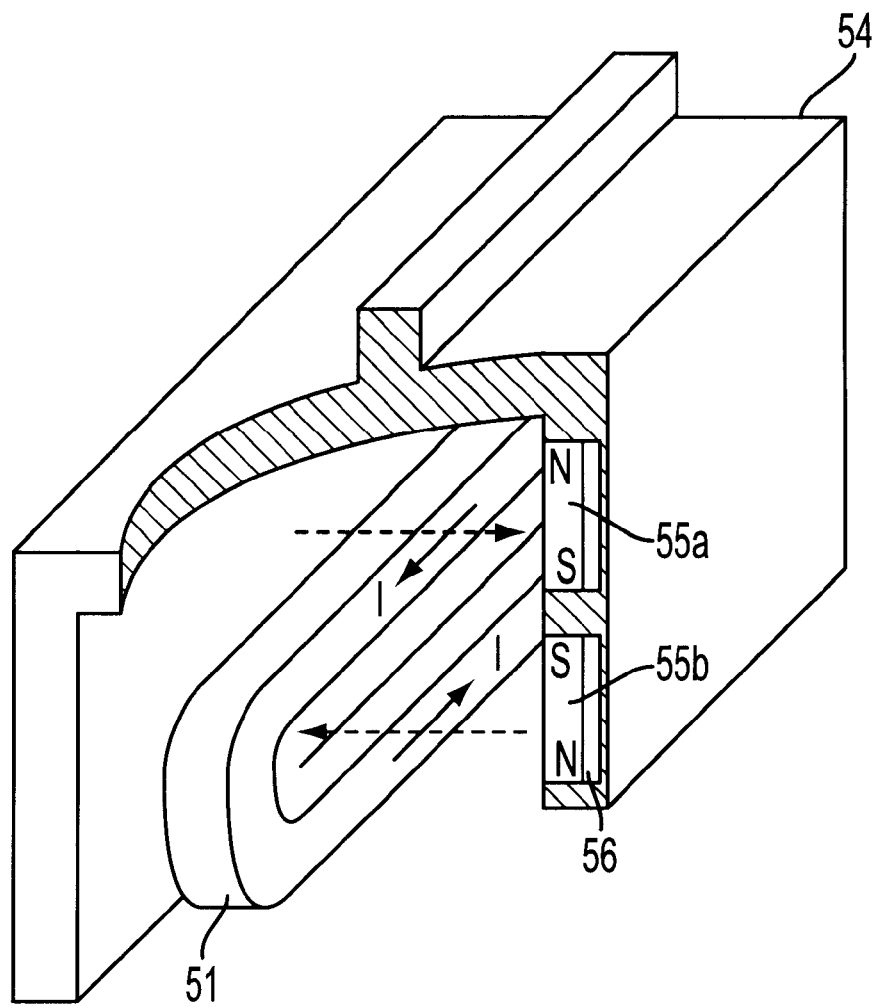
FIG. 4 is a three-dimensional schematic view of a linear motor having a cutaway portion.

FIG. 4 is a three-dimensional view of LDM 50. Rotor 54 has permanent magnets 55a and 55b which are arranged parallel to each other. The opposite side, across the stator (coil member) 51, has the same structure as seen in FIG. 3. The N pole of the permanent magnet 55a and the S pole of the permanent magnet 55b are located on the side of the stator 51. Therefore, a magnetic field in the X direction results, which is indicated by the two dotted lines. The strength of the magnetic field so generated can be changed in accordance with the magnetic force of the permanent magnets 55 or the thickness of the yoke 56 section. In the stator 51, an electric current is induced to pass through in the +Y direction of the –Y direction. So Lorentz Power is produced. Rotor 54 moves in the Z direction, as illustrated in FIG. 4.

Table 30 is made of material such as ceramics or carbon fibers. Table 30 is capable of moving in the Z, Wx and Wy directions by means of the LDM 50 electromagnetic drive. For example, when equal amounts of electric current pass through all three stators, table 30 will move vertically in the Z direction while maintaining itself to be horizontally stable. If equal amounts of electric current pass through only two of the stators, table 30 will move (rotate) in the direction of Wx, Wy, or a combination of the two. If electric current passes through only one of the stators, table 30 will move (rotate) in a direction which is a combination of Wx and Wy.

Table 30 is equipped with a wafer holder 60, which statically clings to a wafer 61, and includes movable mirrors 62 and 63 for a laser interferometer. When these mirrors 62 and 63 receive laser beams from an interferometer (not shown), the X,Y coordinates of the table 30 can be determined to the precision of a 0.01 micrometer. As a result, the table can be positioned with six degrees of freedom when the support system of the present embodiment is installed in an XY stage (not shown). Permanent magnets 15a–15c are respectively affixed through the yoke 17 to the upper surface of the extensions 31a–31c of table 30. These permanent magnets 15a–15c are paired with the permanent magnets 14a–14c, respectively, and therefore four magnets are equally positioned on each of the extensions 31a–31c opposite the permanent magnets 14.

As described above, in the support system of the first embodiment, permanent magnets 14 are affixed to stage 10 (connectors 53) and permanent magnets 15 are affixed to table 30 (extensions 31). Since the SN pole of permanent magnets 14 face the NS pole of permanent magnets 15, the attractive force F of the permanent magnets is equal to the self weight W1 of table 30. Under these circumstaeces, LDM 50 barely consumes electricity. Since each component is kept apart, undesirable effects such as friction hysteresis can also be prevented.

The following methods are used in order to balance the attractive force F of the permanent magnets and the self weight W1 of table 30:

1. Change the thickness of permanent magnets 14 and 15.
2. Change the thickness of yokes 16 and 17 through which permanent magnets 14 and 15 are attached. This, however, does not mean to change the distance between the permanent magnets, but rather refers to altering the density of magnetic force by changing the thickness of the yokes.
3. Use permanent magnets 14 and 15 of different magnetic force.
4. Use additional springs.

As shown in FIG. 2 (plan view of the support system), in the first embodiment, permanent magnets 14 are arranged uniformly on the second surface of 53a-2 of the connector 53a, four magnets to a surface, centering the LDM's driving force generating point. The LDM's driving force generating point also is equal to the point of action of the leaf springs 20. The point of action of the resultant attractive force F from four pairs of permanent magnets 15 is approximately equal to the LDM's driving force generating point in the vertical direction (Z direction). Unless the point of application of resultant attractive force F, the leaf springs' point of application, and the LDM's driving force generating point are equal, the moment M from the leaf spring 20 which supports table 30 will become effective, resulting in lower positioning precision. By adjusting one or more pairs of permanent magnets 14 and 15 with the above-described methods 1 through 4, the point of application of the resulting attractive force F, the leaf springs' point of application, and the LDM's driving force generating point can be made equal. The four pairs of permanent magnets 14 and 15 are arranged along the edge, centering the LDM's driving force generating point in order to cancel the leaf springs' 20 moment rigidity.

Figure 5:
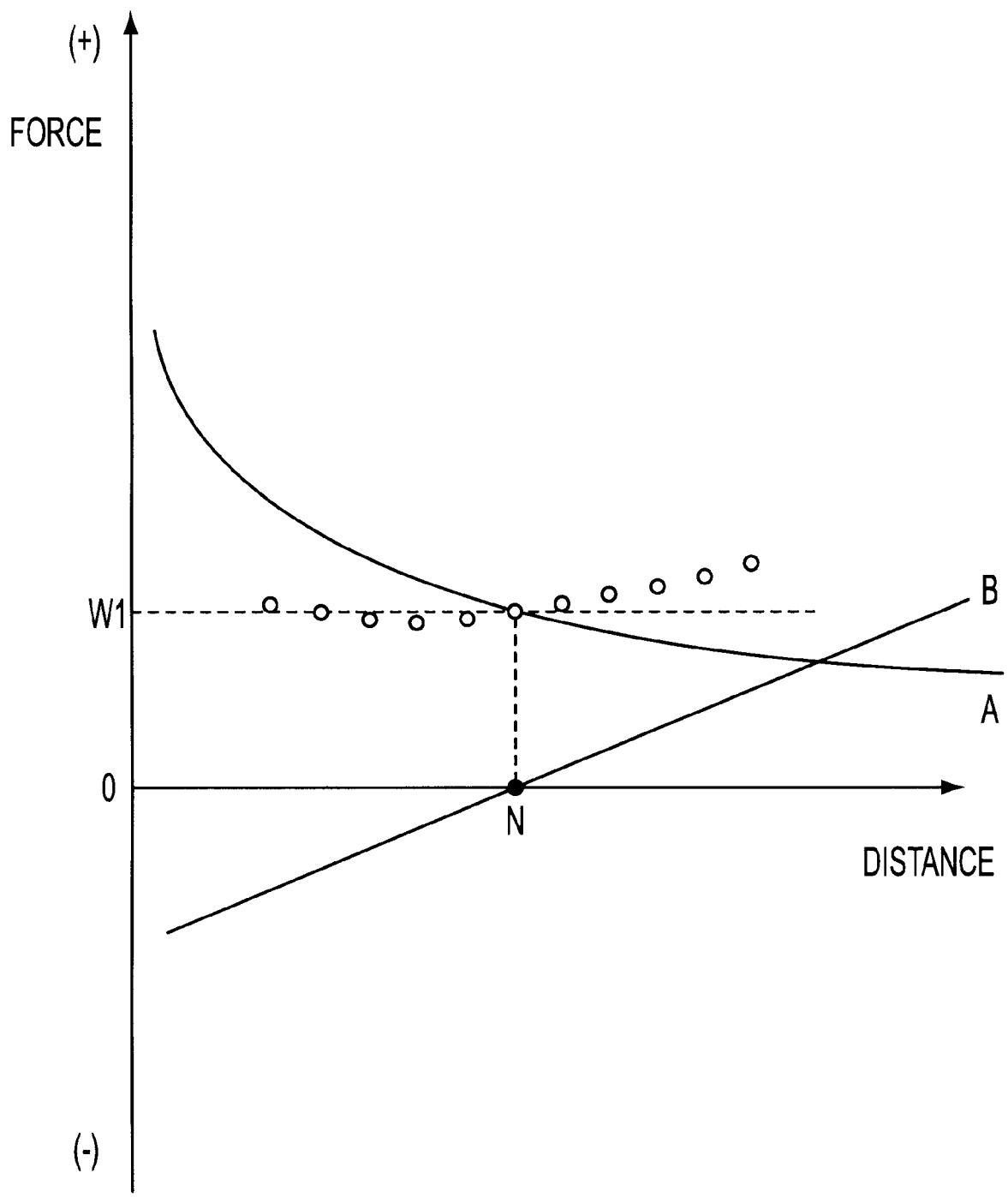
FIG. 5 shows graphical waveforms depicting the relationship of distance and reactive force for different elements of the first embodiment.
Figure 6:
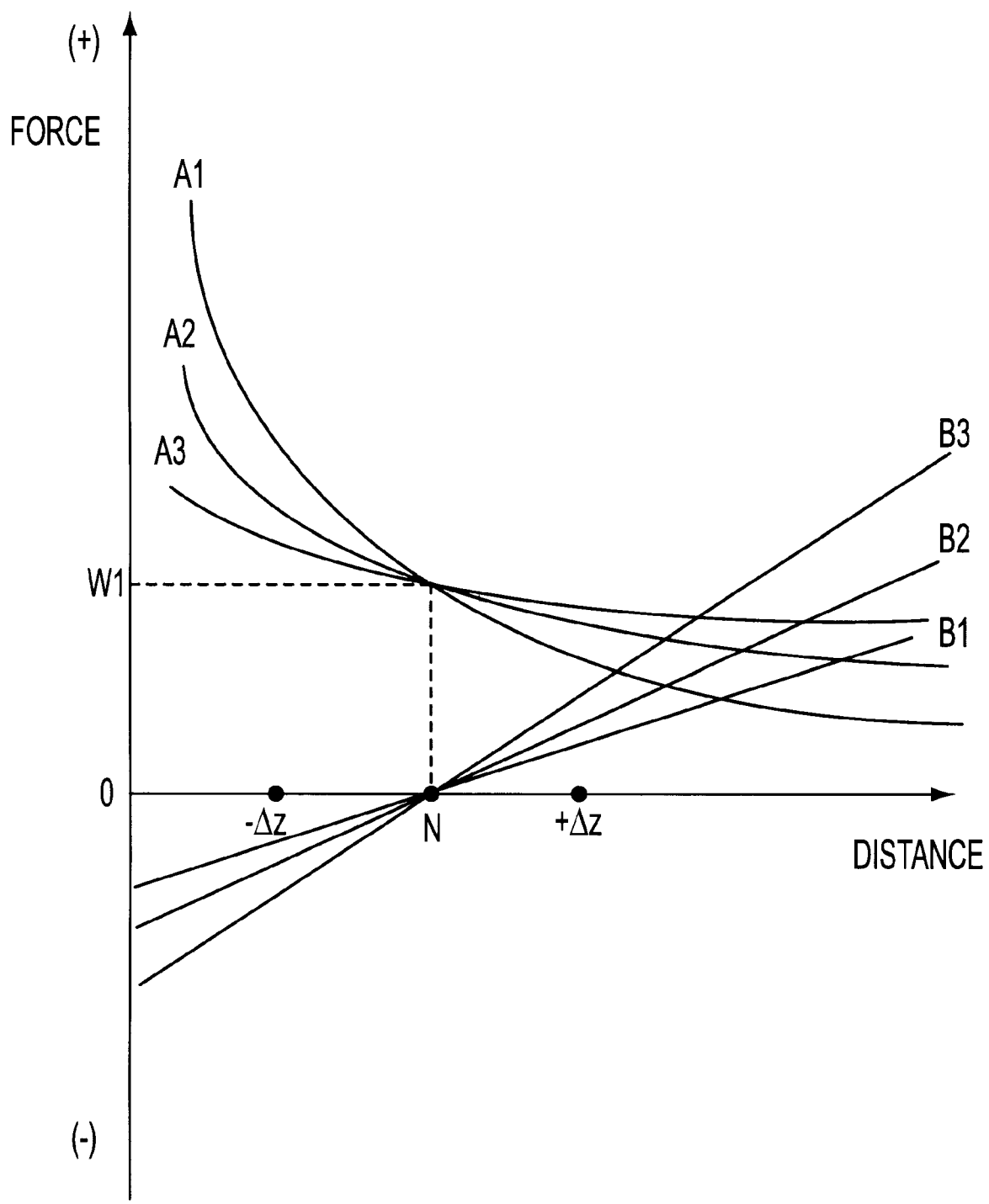
FIG. 6 shows graphical waveforms depicting the relationship of distance and reactive force of elements of the first embodiment.

FIG. 5 and FIG. 6 below describe the relationship between the attractive force F of permanent magnets 14 and 15 and the reactive force of leaf spring 20.

In FIG. 5 and FIG. 6, the axis of the ordinates represents the force, indicating the attracting force between stage 10 and table 30 as a positive and the repelling force between stage 10 and table 30 as a negative. In FIG. 5 and FIG. 6, the axis of abscissas represents the distance between stage 10 and table 30 (distance between connector's 53 second surface 53-2 and extension's 31 upper surface). A curved line A describes the relationship between the attractive force F of the permanent magnets 14 and 15. A straight line B describes the relationship between the leaf spring's 20 flexure amount (in distance) and the reactive force F. The self weight W1 of table 30 and the attracting force F of permanent magnets 14 and 15 are balanced in a neutral position, N. Therefore, the reactive force of the leaf spring 20 due to flexure is 0.

When table 30 is moved from a neutral position (N) in the Z direction ($-\Delta z$), the distance between permanent magnets 14 and 15 will become smaller and therefore the attractive force F of permanent magnets 14 and 15 will become stronger. At the same time, the leaf spring 20, too, is bent toward the Z direction ($-\Delta z$), resulting in a force applied to table 30 to separate stage 10 and table 30. On the other hand, if table 30 is moved from a neutral position (N) in the Z direction ($+\Delta z$), the distance between permanent magnets 14 and 15 will become larger and therefore the attracting force F of permanent magnets 14 and 15 will diminish. At the same time, the leaf spring 20, too, is bent toward the Z direction ($+\Delta z$), resulting in a force applied to table 30 which attracts stage 10 to table 30. The "o" marks in FIG. 5 describe the balanced state of each of the Z direction experiments. Each "o" marks approximately the same with the self weight W1 of table 30. In other words, by balancing the increased amount of the attractive force F and the separating force of the leaf spring 20, the necessity of having electric current flow throughout the coil section (stator) 51 of LDM 50 is kept to a minimum in the $-\Delta z$ position, while by balancing the attaching force of the leaf spring 20 and the decreased amount of attracting force F, the need of having electric current flow through the coil section 51 of LDM 50 in $+\Delta z$ position is also kept to a minimum.

As thus far described, LDM 50 is needed to continuously generate the driving force that counterbalances the reactive force of the leaf spring 20 in order to keep table 30 in a certain position ($-\Delta z$ or $+\Delta z$). As a result, coil section (stator) 51 not only consumed electricity but also generated heat, causing a problem of decreased positioning precision. The present invention, however, minimizes the need for the consumption of electricity while increasing the accuracy of positioning precision.

Since the attractive force F of permanent magnets 14 and 15 with varied strength of magnetic forces is shown as curved lines A1–A3 in FIG. 6, it possesses a characteristic of negative rigidity. The reactive force of leaf spring 20 possesses a characteristic of positive rigidity as shown by the straight lines B1–B3 in FIG. 6. Therefore, it is necessary to make adjustments so that the increased or decreased amount of the attractive force F and the reactive force of the leaf spring 20 is well-balanced. For example, when attractive force F of permanent magnets 14 and 15 is a curved line A1, use is made of the leaf spring 20, the reactive force of which is that of a straight line B1. When the attractive force F of permanent magnets 14 and 15 is a curved line A2, use is made of the leaf spring 20, the reactive force of which is that of straight line B2. When attractive force F of permanent magnets 14 and 15 is that of a curved line A3, use is made of the leaf spring 20, the reactive force of which is that of a straight line B3.

In order to match the rigidity of attractive force F of the permanent magnets 14 and 15 as exhibited in curved lines A1–A3, layers of the leaf springs can also be used to make the line of a reactive force curved. In reality, though, it is very rare to require vertical movement of table 30 through a large distance. Therefore, there is little necessity in balancing the attractive F and the reactive force of the leaf spring 20 over a wide range, but rather over only limited areas near the neutral position (N).

The characteristics of the attractive force of the permanent magnets can be obtained through experimentation ahead of time or through magnetic field analysis in order to match to the rigidity of leaf spring 20. Also, final adjustment can be done through the above-described methods 1 through 4.

Figure 7:
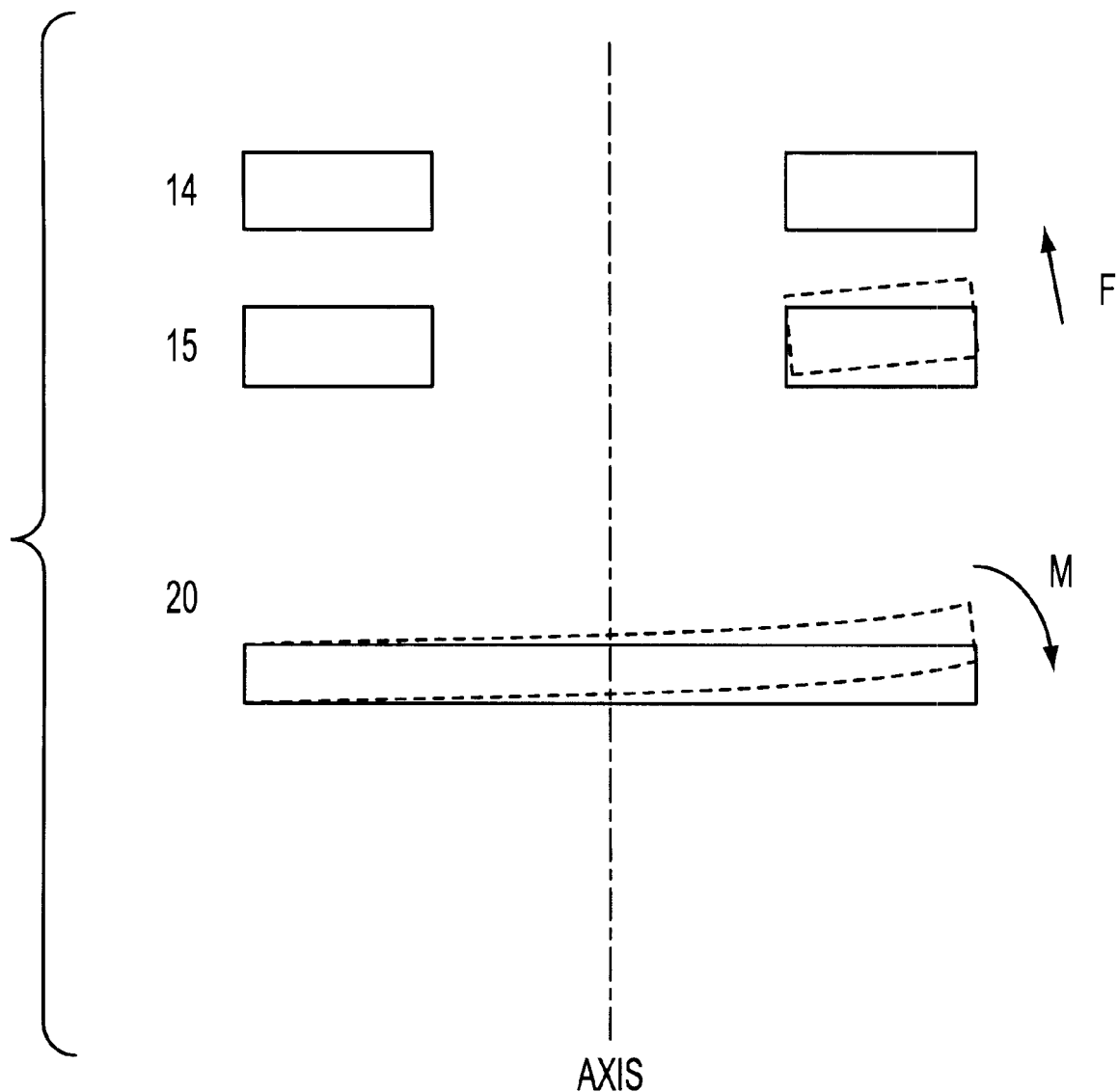
FIG. 7 is a schematic diagram describing the relationship between the moment M of leaf spring 20 and the counterbalancing attractive force F of a pair of magnets.

The same can be said regarding the moment M of leaf spring 20. As is shown in FIG. 7, when table 30 rotates around the X-axis or the Y-axis (Wx or Wy direction), the moment M, which is caused by moment rigidity of the leaf spring 20 when it rotates around X-axis and Y-axis, will be applied to table 30. In the first embodiment, four pairs of permanent magnets 14 and 15 are arranged around the leaf spring's 20 point of application. Each pair of magnets produces an attractive force F with negative rigidity, hence becoming a negative moment rigidity. The attractive force F of paired permanent magnets counterbalances the moment M, and by approximating the absolute value of this negative moment rigidity and the absolute value of the leaf spring's 20 positive rigidity, table 30 receives little external force when it moves around the X-axis or Y-axis. This, in turn, minimizes the distortion of table 30.

As has been described, the characteristics of attractive force of the permanent magnets can be obtained through experimentation ahead of time, or through magnetic field analysis in order to match the moment rigidity of leaf spring 20. Final adjustment can also be accomplished through the above-described method 1 through 4. As explained, little external force affects table 30 when it moves in the Z, Wx, and Wy directions, resulting in minimum heat produced around the coil section 51 of LDM 50 with minimum distortion.

This enables the table to position itself with a very high precision accuracy.

Figure 8:
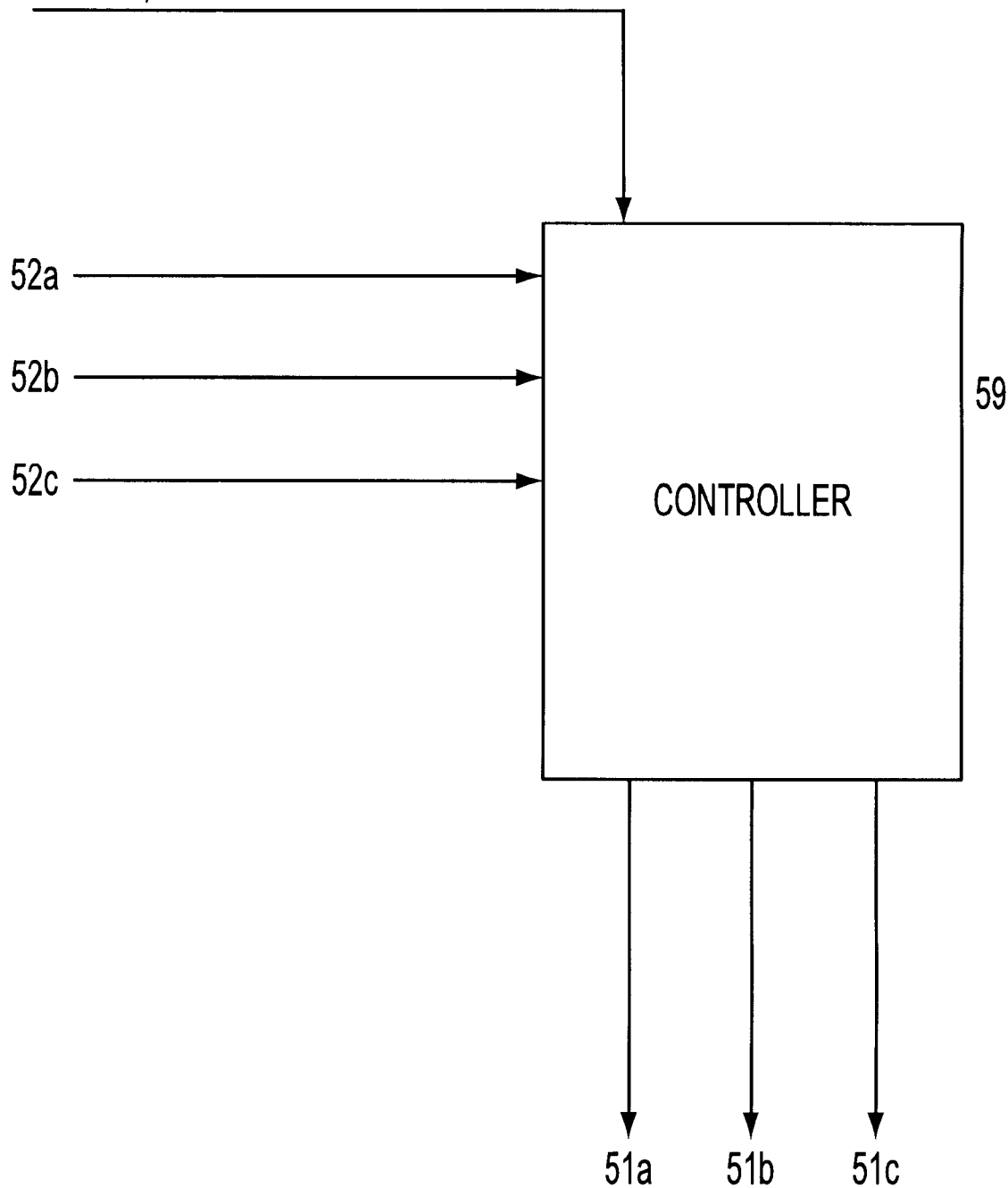
FIG. 8 is a block diagram illustrating the inputs and outputs of the controller used for the embodiments of the present invention.

Referring to FIG. 8, the action of the support system will be described.

The support system of the present embodiment has been applied to a projection light exposure device which is used for manufacturing semiconductors. The projection light exposure device is equipped with a focusing device for detecting the surface height and tilt angle of the wafer 61. Based on the information corrected by focusing, the focusing device sends output signals to a controller 59 as to how much the table 30 should be moved vertically and at a certain angle for exposing wafer 61. The capacitance sensors also send output to the controller 59, signaling the distance between table 30 and stage 10 at three separate locations.

The controller 59 calculates the height and tilt angle of table 30 based on the signaled information regarding the distance between table 30 and stage 10 at three locations. Then, the controller compares the height of table 30 and tilt information and output signals from the focusing devices, calculates appropriate amounts of electric current that should be passed through the stators (single-phase coil) 51a–51c of LDM 50, and outputs the signal. The electromagnetic driving force of LDM 50, in turn, enables table 30 to move freely in the Z, Wx, and Wy directions. Again, controller 59 receives output signals from the focusing device and distance signals from the capacitance sensors 52a–52c, initiating the feedback control cycle. When the output from the focusing device reaches a certain allowable range, feedback control is completed.

The following section describes the second embodiment of the present invention.

Figure 9:
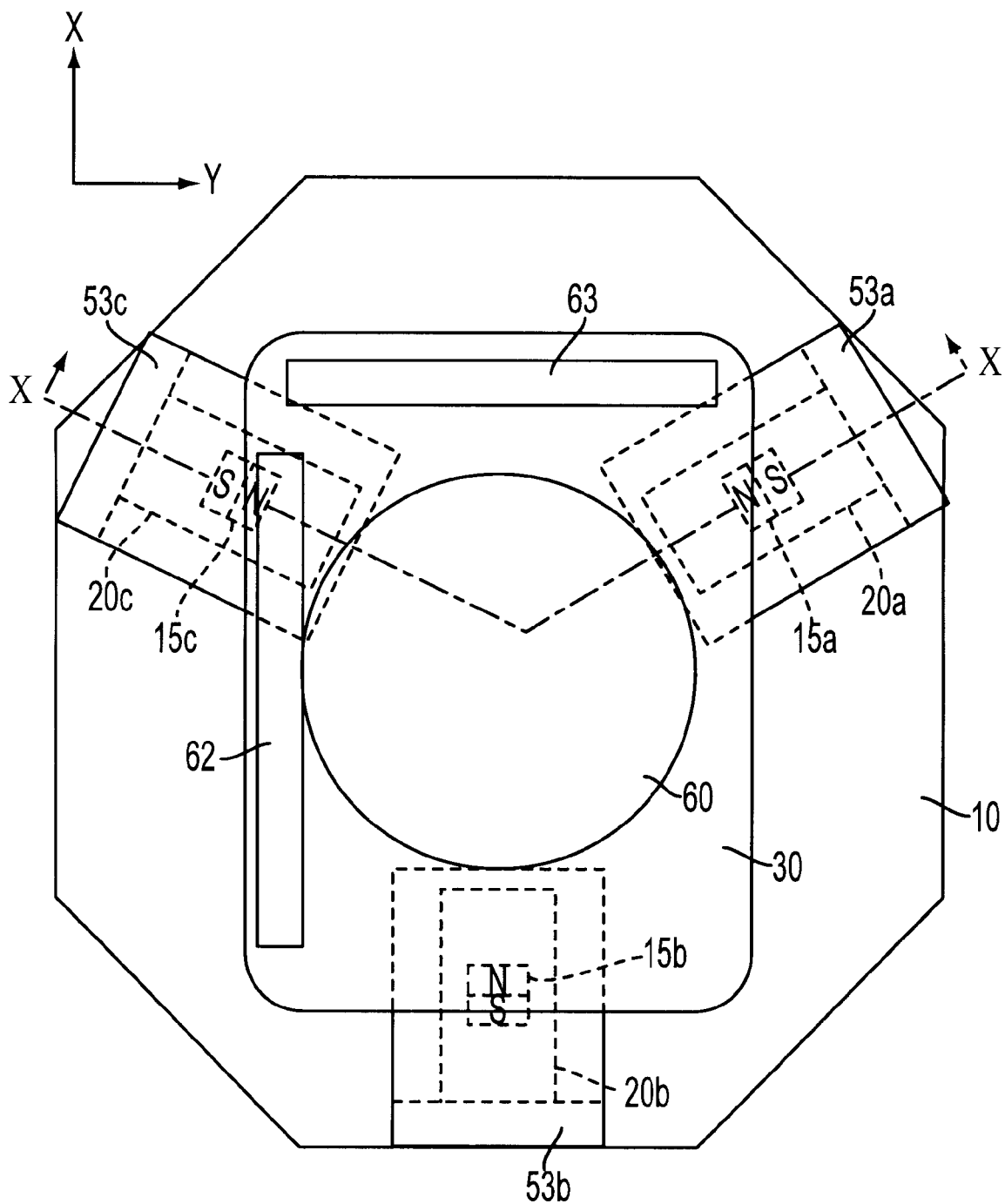
FIG. 9 is a plan view of the support system of a second embodiment of the present invention.
Figure 10:
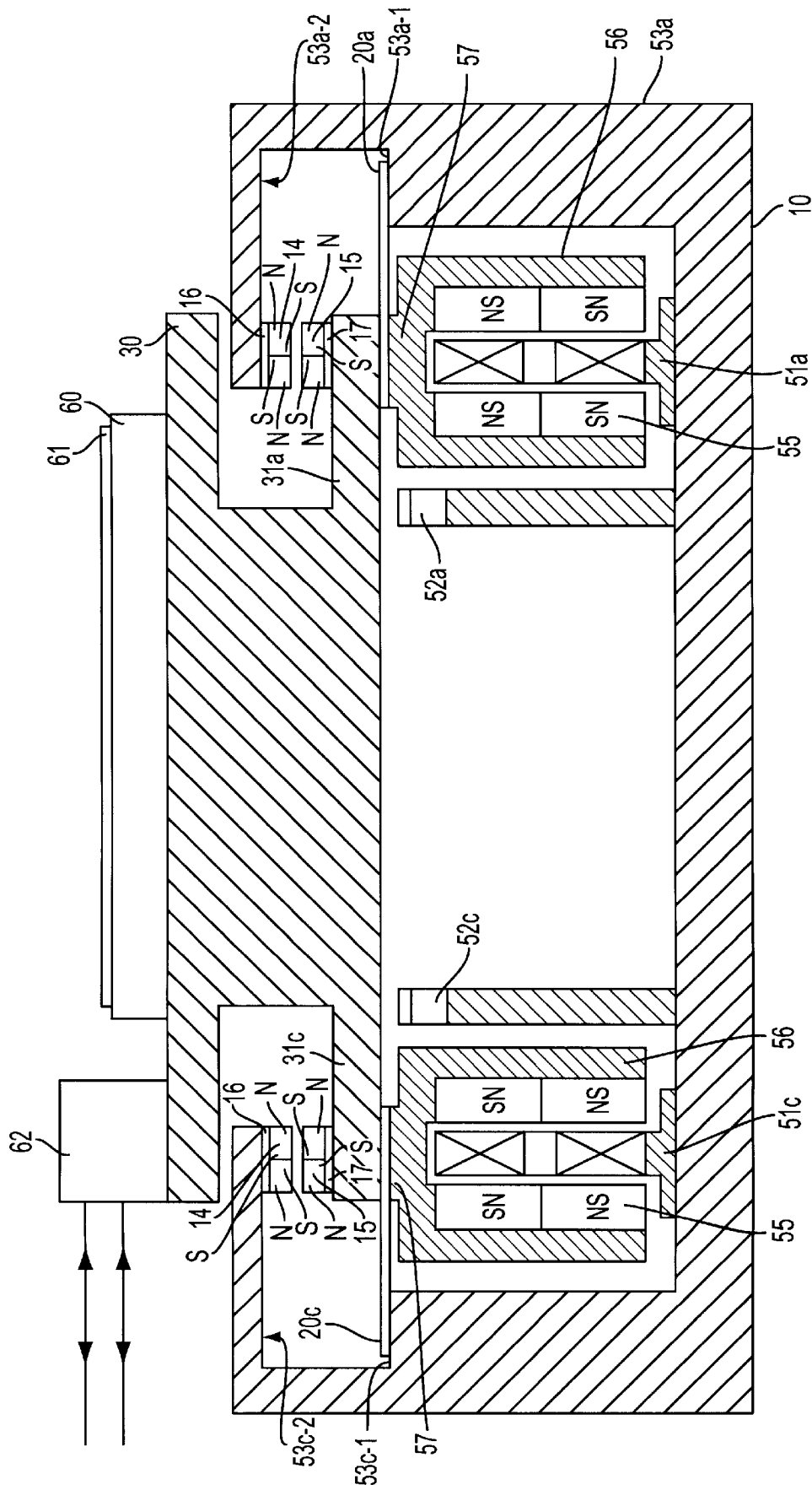
FIG. 10 is a cross-section view taken along the line X—X of the support system shown in FIG. 9 and turned ninety degrees.
Figure 11A:
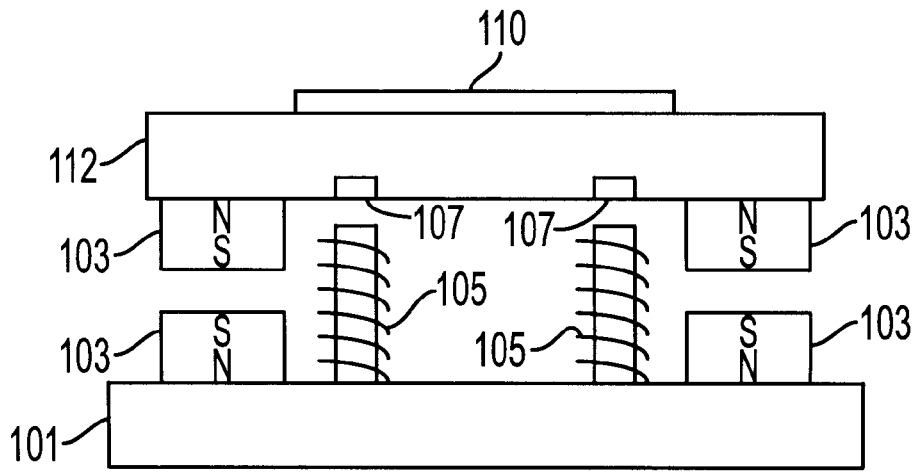
FIG. 11 includes FIGS. 11(a) and 11(b) which are plan views of the support system of the prior art.
Figure 11B:
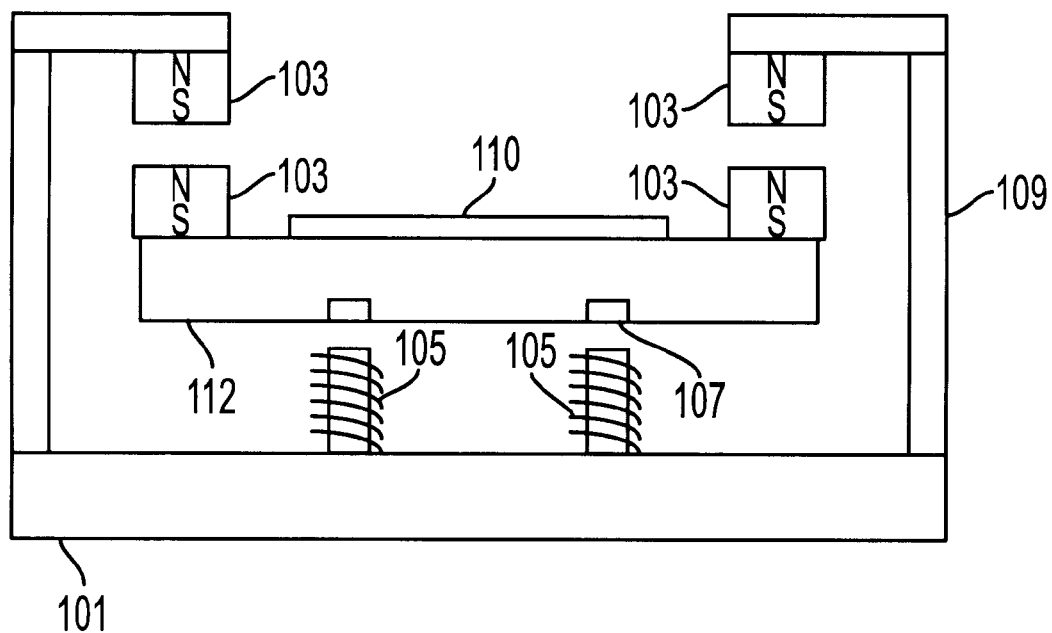

FIG. 9 is a plan view and FIG. 10 is a cross-sectional view taken along the line X—X of FIG. 9 of the second embodiment of the support system. The major difference between the first embodiment and the second embodiment lies in the fact that the second embodiment contains only one pair of permanent magnets 14 and 15.

As shown, the permanent magnets 14 and 15 are arranged in positions approximately perpendicular (the Z direction) to LDM's point of generating driving force. The cost involved in this second embodiment is naturally lower than the first embodiment since there is only one pair of permanent magnets. However, there is the problem of the moment, M, from which the leaf spring occurs. In order to overcome the problem of the moment, M, the leaf springs 20a–20c used in the second application have slits in the lengthwise direction as well as in the width direction, making its rigidity in directions other than horizontal (Z, Wx, and Wy directions) proportionally higher when compared with the rigidity in the horizontal directions (X and Y directions). In other words, the second embodiment reduces the moment M of leaf spring 20 to a minimum, while sustaining the horizontal restriction of table 30 itself. By doing so, the moment rigidity of leaf spring 20 will become negligible, hence only one pair of attracting magnets 14 and 15 needs to be arranged on the vertical line between the point of action of leaf spring 20 and the point of action of the electromagnetic driving system.

While the first and the second embodiments both use permanent magnets as a source of the attractive force between stage 10 and table 30, other methods can also be used such as replacing one of the permanent magnets with materials that can be magnetized such as iron. Also the use of coil section 51 as a stator of LDM 50 and permanent magnet 55 and yoke 56 as a rotor in the present embodiments can be interchanged with the use of permanent magnet 55 and yoke 56 as a stator and coil section 51 as a rotor.

The support system of the present embodiments adopts magnetic flotation and does not require the existence of air, which makes it an optimum choice when the table positioning has to be performed in a vacuum, such as in the case of an electron beam (EB) light exposure device.

The effects of the apparatus incorporating the principles of the present invention are as follows:

1. Regardless of the table's position, whether in Z, Wx, or Wy direction, the external force applied to the table is kept at a minimum, hence the electrical consumption of the electromagnetic driving system is also a minimum, which in turn minimizes the error caused by the table's heat distortion. As a result, highly precise positioning is possible.

2. Regardless of the table's position, whether in Z, Wx, or Wy direction, the external force applied to the table is kept at a minimum, hence the distortion of the table is also kept at a minimum. As a result, highly precise positioning is possible.

Various modifications will become possible for those skilled in the art after receiving the teachings of the present disclosure without departing from the scope thereof.

What is claimed is:

1. A supporting apparatus for supporting a table having N degrees of freedom, where N is an integer greater than one, said apparatus comprising:

a stage;

a leaf spring mounted on said stage and initially contacting said table at a contact point, said leaf spring having a coefficient of elasticity greater in a first direction and smaller in a direction perpendicular to said first direction, and having a characteristic of positive rigidity; and a pair of permanent magnets mounted in an area between said stage and said table, in an arrangement such that magnetic poles of said permanent magnets oppose each other and are arranged in a direction perpendicular to said first direction, said pair of permanent magnets generating a force that substantially corresponds to the self weight of said table at a neutral position and counterbalancing said characteristic of positive rigidity of said leaf spring.

2. Apparatus, as claimed in claim 1, further comprising a driving device having a driving force for driving said table in said direction perpendicular to said first direction.

3. Apparatus, as claimed in claim 2, wherein said driving device includes an electromagnetic driving system.

4. Apparatus, as claimed in claim 2, wherein said pair of permanent magnets have a point of action and said leaf spring has a point of action, said points of action being substantially equal to said driving force of said driving device in said direction perpendicular to said first direction.

5. Apparatus, as claimed in claim 1, wherein said stage is mounted in a horizontal plane and said first direction is the horizontal direction.

6. Apparatus, as claimed in claim 1, wherein said pair of permanent magnets is arranged in the vicinity of said contact point of said leaf spring and said table.

7. Apparatus as claimed in claim 1, wherein said pair of permanent magnets generates an attractive force.

8. A supporting apparatus for supporting a table having N degrees of freedom, where N is an integer greater than one, said apparatus comprising:

a stage arranged in a horizontal plane;

a guide member coupled to said stage and to said table, said guide member having a coefficient of elasticity greater in the horizontal direction and smaller in the vertical direction and having a characteristic of positive rigidity; and a permanent magnet system having at least two magnets arranged such that magnetic poles of said permanent magnets oppose each other, said permanent magnet system generating a force that substantially corresponds to the self weight of said table at a neutral position and having a characteristic of negative rigidity which counterbalances said characteristic of positive rigidity of said guide member.

9. Apparatus, as claimed in claim 8, further comprising an electromagnetic drive system having at least three electromagnets for driving said table in said N degrees, said table being driven in the vertical direction when all of the electromagnets are simultaneously equally energized.

10. Apparatus, as claimed in claim 9, wherein said table is tilted away from the horizontal direction when less than said three electromagnets are simultaneously energized.

11. Apparatus, as claimed in claim 9, wherein said permanent magnet system and said guide member each have a respective point of action and said electromagnetic driving system has a driving force generating point and wherein said point of action of said permanent magnet system and said point of action of said guide member are substantially equal to driving force generating point in the vertical direction.

12. Apparatus, as claimed in claim 9, wherein said electromagnetic drive system is mounted on said stage and said three electromagnets are spaced 120 degrees from each other on said stage.

13. Apparatus, as claimed in claim 8, wherein said guide member is coupled to said stage and said table at a connection point and said permanent magnet system contains first and second pairs of permanent magnets symmetrically located with respect to said connection point.

14. Apparatus, as claimed in claim 8, wherein said permanent magnet system contains first and second pairs of permanent magnets, said first pair being mounted on said stage and said second pair being mounted on said table.

15. Apparatus as claimed in claim 8, wherein said permanent magnet system generates an attractive force.

16. A supporting apparatus for supporting a table comprising:
   a stage;
   a guide member which connects said stage and said table, said guide member having a characteristic of positive rigidity in a first direction;
   a magnetic member having at least two member portions with each member portion having magnetic poles, said member portions being arranged such that said magnetic poles of said member portions oppose each other, said magnetic member generating a force that substantially corresponds to the self weight of said table at a neutral position and having a characteristic of negative rigidity for counterbalancing said characteristic of positive rigidity of said guide member.

17. Apparatus as claimed in claim 16, further comprising a drive device which drives said table in said first direction.

18. Apparatus as claimed in claim 17, wherein the drive device includes an electromagnetic driving system.

19. Apparatus as claimed in claim 18, wherein said magnetic member and said guide member each have a respective point of action and said electromagnetic driving system has a driving force generating point, and wherein said point of action of said magnetic member and said point of action of said guide member are substantially equal to said driving force generating point of said electromagnetic driving system in a second direction perpendicular to said first direction.

20. Apparatus as claimed in claim 17, wherein said magnetic member has a point of action and the guide member has a point of action, said points of action being substantially equal to said driving force of the drive device in a second direction perpendicular to said first direction.

21. Apparatus as claimed in claim 16, wherein said magnetic member is mounted on said stage or said table.

22. Apparatus as claimed in claim 16, wherein said magnetic member is arranged in the vicinity of said guide member.

23. Apparatus as claimed in claim 16, wherein the guide member has a coefficient of elasticity which is greater in the first direction and smaller in a second direction perpendicular to said first direction.

24. Apparatus as claimed in claim 16, further comprising a drive device including an electromagnetic driving system having three electromagnets for driving said table, said table being driven in one direction when said three electromagnets of said electromagnetic driving system are simultaneously energized.

25. Apparatus as claimed in claim 24, wherein said table is tilted away from the first direction when less than said three electromagnets of said electromagnetic system are simultaneously energized.

26. Apparatus as claimed in claim 24, wherein said electromagnetic driving system is mounted on said stage and said three electromagnets are spaced 120 degrees from each other on said stage.

27. Apparatus as claimed in claim 16, wherein the guide member is coupled to said stage and said table at connection points and said magnetic member contains first and second pairs of permanent magnets, said first pair of permanent magnets and said second pair of permanent magnets being symmetrically located with respect to said connection points.

28. Apparatus, as claimed in claim 16, wherein said magnetic member contains pairs of permanent magnets, one of said pair of permanent magnets being connected to said stage, the other of said pair of permanent magnets being connected to said table.

29. Apparatus as claimed in claim 16, wherein said magnetic member generates an attractive force.

30. Apparatus as claimed in claim 16, wherein said supporting apparatus is adapted to be used as a stage apparatus for an exposure apparatus.

31. A method of manufacturing a supporting apparatus for supporting a table, the method comprising the steps of:
   providing a stage;
   providing a guide member which connects said stage and said table, said guide member having a characteristic of positive rigidity in a first direction;
   providing a magnetic member having at least two member portions with each member portion having magnetic poles, said member portions being arranged such that said magnetic poles of said member portions oppose each other, said magnetic member generating a force that substantially corresponds to the self weight of said table at a neutral position and having a characteristic of negative rigidity for counterbalancing said characteristic of positive rigidity of said guide member.

32. A method as claimed in claim 31, further comprising the step of providing a drive device which drives said table in said first direction.

33. A method as claimed in claim 32, wherein the drive device includes an electromagnetic driving system.

34. A method as claimed in claim 33, wherein said magnetic member and said guide member each have a respective point of action and said electromagnetic driving system has a driving force generating point, and wherein said point of action of said magnetic member and said point of action of said guide member are substantially equal to said driving force generating point of said electromagnetic driving system in a second direction perpendicular to said first direction.

35. A method as claimed in claim 32, wherein said magnetic member has a point of action and the guide member has a point of action, said points of action being substantially equal to said driving force of the drive device in a second direction perpendicular to said first direction.

36. A method as claimed in claim 32, wherein the guide member has a coefficient of elasticity which is greater in the first direction and smaller in a second direction perpendicular to said first direction.

37. A method as claimed in claim 31, wherein said magnetic member is mounted on said stage or said table.

38. A method as claimed in claim 31, wherein said magnetic member is arranged in the vicinity of said guide member.

39. A method as claimed in claim 31, further comprising a step of providing a drive device including an electromagnetic driving system having three electromagnets for driving said table, said table being driven in one direction when said three electromagnets of said electromagnetic driving system are simultaneously energized.

40. A method as claimed in claim 39, wherein said table is tilted away from the first direction when less than said three electromagnets of said electromagnetic driving system are simultaneously energized.

41. A method as claimed in claim 39, wherein said electromagnetic driving system is mounted on said stage and said three electromagnets are spaced 120 degrees from each other on said stage.

42. A method as claimed in claim 31, wherein the guide member is coupled to said stage and said table at connection points and said magnetic member contains first and second pairs of permanent magnets, said first pair of permanent magnets and said second pair of permanent magnets being symmetrically located with respect to said connection points.

43. A method as claimed in claim 31, wherein said magnetic member contains pairs of permanent magnets, one of said pair of permanent magnets being connected to said stage, the other of said pair of permanent magnets being connected to said table.

44. Method as claimed in claim 31, wherein said magnetic member generates an attractive force.

45. Method as claimed in claim 31, wherein said supporting apparatus is adapted to be used as a stage apparatus for an exposure apparatus.

46. A supporting apparatus for supporting a table comprising:
   a stage;
   a leaf spring mounted at one end to the stage and at the other end to the table; and
   a pair of permanent magnets mounted between the stage and the table in an arrangement such that magnetic poles of said permanent magnets oppose each other,
   wherein the pair of permanent magnets and the leaf spring interact such that when the leaf spring is at a neutral position the pair of permanent magnets generate a force that substantially corresponds to a self weight of the table.

* * * * *